(12) United States Patent
Zheng et al.

(10) Patent No.: US 10,939,600 B2
(45) Date of Patent: Mar. 2, 2021

(54) FLUX RESIDUE DETECTION

(71) Applicant: INTERNATIONAL BUSINESS MACHINES CORPORATION, Armonk, NY (US)

(72) Inventors: Jiayu Zheng, Shenzhen (CN); WeiFeng Zhang, Shenzhen (CN); Lin Zhao, Shenzhen (CN); XiYuan Yin, Guangzhou (CN); Tao Song, Shenzhen (CN); James Bielick, Pine Island, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/202,241

(22) Filed: Nov. 28, 2018

(65) Prior Publication Data
US 2020/0170155 A1    May 28, 2020

(51) Int. Cl.
*B23K 1/00*    (2006.01)
*H05K 13/08*    (2006.01)
(Continued)

(52) U.S. Cl.
CPC ......... *H05K 13/0817* (2018.08); *B23K 1/203* (2013.01); *B23K 35/362* (2013.01);
(Continued)

(58) Field of Classification Search
CPC ........... H05K 13/0817; H05K 13/0061; H05K 3/3489; H05K 3/0085; H05K 3/3468;
(Continued)

(56) References Cited

U.S. PATENT DOCUMENTS

| 3,750,745 A | 8/1973 | Moore |
| 4,077,467 A | 3/1978 | Spigarelli |

(Continued)

FOREIGN PATENT DOCUMENTS

| CN | 101936771 A | 1/2011 |
| CN | 106670616 A | 5/2017 |

(Continued)

OTHER PUBLICATIONS

Dominguez et al., "Novel Automatic Inspection Technique for Detecting Thermal Residual Deformation on PCBs Using a Laser Sensor", 6 pages, accessed Nov. 20, 2018.
(Continued)

*Primary Examiner* — Kiley S Stoner
(74) *Attorney, Agent, or Firm* — L. Jeffey Kelly (57) ABSTRACT

A system for flux residue detection is provided. The system includes a flux heater, where the flux heater controls a temperature of a flux spray applied to a printed circuit board, and an infrared camera, wherein the infrared camera provides a thermal image of the flux on the printed circuit board. A method, a computer system, and a computer program product for flux residue detection is provided, including setting flux application parameters, applying flux to a printed circuit board, and capturing an infrared image of the flux applied to the printed circuit board. A method, a computer system, and a computer program product for flux residue detection is provided, including setting flux application parameters, applying flux to a printed circuit board, capturing an infrared image of the flux applied to the printed circuit board, and determining there is excess flux residue on the printed circuit board.

9 Claims, 6 Drawing Sheets

(51) Int. Cl.
| | |
|---|---|
| *H05K 13/00* | (2006.01) |
| *H05K 3/34* | (2006.01) |
| *H05K 3/00* | (2006.01) |
| *H04N 5/33* | (2006.01) |
| *B23K 1/20* | (2006.01) |
| *G06T 7/00* | (2017.01) |
| *B23K 35/362* | (2006.01) |
| *B23K 101/42* | (2006.01) |

(52) U.S. Cl.
CPC ............. *G06T 7/0004* (2013.01); *H04N 5/33* (2013.01); *H05K 3/0085* (2013.01); *H05K 3/3468* (2013.01); *H05K 3/3489* (2013.01); *H05K 13/0061* (2013.01); *B23K 2101/42* (2018.08); *G06T 2207/10048* (2013.01); *G06T 2207/30141* (2013.01); *G06T 2207/30152* (2013.01); *H05K 2203/0475* (2013.01); *H05K 2203/163* (2013.01)

(58) Field of Classification Search
CPC ...... H05K 2203/163; H05K 2203/0475; G06T 7/0004; G06T 2207/10048; G06T 2207/30152; G06T 2207/30141; B23K 1/203; B23K 3/082; B23K 35/362; B23K 35/365; B23K 35/368; B23K 3/0638; B23K 3/0623; B23K 35/025; B23K 2101/42; H04N 5/33
USPC .......... 228/248.1–248.5, 102–103, 105, 207, 228/223–224, 33–43, 8–11; 148/23–24
See application file for complete search history.

(56) References Cited

U.S. PATENT DOCUMENTS

| | | | |
|---|---|---|---|
| 4,149,665 A | 4/1979 | Frosch | |
| 4,185,183 A | 1/1980 | Kamimoto | |
| 4,419,692 A | 12/1983 | Modisette | |
| 4,484,048 A | 11/1984 | Travers | |
| 4,649,261 A | 3/1987 | Sheets | |
| 4,698,486 A | 10/1987 | Sheets | |
| 4,751,360 A | 6/1988 | Ross | |
| 4,752,027 A * | 6/1988 | Gschwend | B23K 3/06 228/180.22 |
| 4,776,508 A * | 10/1988 | Tanny | B23K 1/08 118/423 |
| 4,792,078 A * | 12/1988 | Takahashi | B23K 3/082 118/602 |
| 4,832,249 A * | 5/1989 | Ehler | B23K 1/0053 219/411 |
| 4,901,907 A | 2/1990 | Enokido | |
| 4,941,256 A * | 7/1990 | Capson | H05K 13/0815 29/833 |
| 5,004,509 A | 4/1991 | Bristol | |
| 5,108,024 A * | 4/1992 | Kazem-Goudarzi | B23K 1/00 228/104 |
| 5,129,962 A * | 7/1992 | Gutierrez | B23K 35/3612 148/23 |
| 5,297,721 A | 3/1994 | Schneider | |
| 5,403,994 A | 4/1995 | Havas | |
| 5,415,337 A * | 5/1995 | Hogan | B05B 12/06 228/223 |
| 5,447,577 A * | 9/1995 | Gao | B23K 35/3618 148/23 |
| 5,507,882 A | 4/1996 | Bristol | |
| 5,540,376 A * | 7/1996 | Asla | B23K 3/0676 228/37 |
| 5,560,534 A * | 10/1996 | Okada | B23K 1/085 228/37 |
| 5,739,506 A | 4/1998 | Hanton | |
| 5,820,697 A * | 10/1998 | Hamilton | B23K 3/08 148/23 |
| 6,034,374 A | 3/2000 | Kimura | |
| 6,059,894 A * | 5/2000 | Pendse | B23K 35/3618 148/23 |
| 6,164,516 A * | 12/2000 | Watanabe | B23K 1/085 228/37 |
| 6,258,612 B1* | 7/2001 | Master | H01L 22/20 148/508 |
| 6,360,935 B1* | 3/2002 | Flake | B23K 1/0016 228/102 |
| 6,367,679 B1* | 4/2002 | Master | B23K 3/029 228/103 |
| 6,441,943 B1 | 8/2002 | Roberts | |
| 6,536,649 B1* | 3/2003 | Master | H01L 21/67253 134/1.1 |
| 6,597,444 B1* | 7/2003 | Halderman | G01N 21/35 228/180.22 |
| 6,599,372 B2 | 7/2003 | Arora | |
| 6,754,551 B1 | 6/2004 | Zohar | |
| 6,758,108 B2* | 7/2004 | Masatoki | B23K 31/12 228/103 |
| 6,827,135 B1 | 12/2004 | Kramer | |
| 6,828,170 B2 | 12/2004 | Roberts | |
| 7,030,339 B2 | 4/2006 | Nagase | |
| 7,361,412 B2 | 4/2008 | Wang | |
| 7,653,511 B2 | 1/2010 | Deram | |
| 8,470,701 B2 | 6/2013 | Rogers | |
| 2002/0034825 A1* | 3/2002 | Schweigart | H05K 3/26 436/100 |
| 2002/0053589 A1* | 5/2002 | Owen | B23K 3/08 228/104 |
| 2003/0136817 A1* | 7/2003 | Stoops | B23K 3/0653 228/207 |
| 2003/0234272 A1* | 12/2003 | Lamothe | B05B 16/95 228/41 |
| 2008/0156851 A1 | 7/2008 | Ramanan et al. | |
| 2009/0120629 A1 | 5/2009 | Ashe | |
| 2009/0152331 A1* | 6/2009 | Schmitt | B23K 35/3618 228/256 |
| 2010/0021050 A1* | 1/2010 | Kakuda | B23K 1/0016 382/150 |
| 2010/0089879 A1* | 4/2010 | Morelle | H05K 3/3478 219/121.64 |
| 2012/0292376 A1 | 11/2012 | Mamber et al. | |
| 2013/0059162 A1* | 3/2013 | Kobayashi | B23K 35/284 428/457 |
| 2014/0151437 A1* | 6/2014 | Choi | H01L 224/75 228/8 |
| 2016/0031031 A1* | 2/2016 | Yamakawa | B23K 1/203 427/8 |
| 2016/0059362 A1* | 3/2016 | Kobayashi | B23K 35/002 148/26 |
| 2018/0185967 A1* | 7/2018 | Muraoka | B23K 3/082 |
| 2019/0090355 A1 | 3/2019 | Steiner | |
| 2020/0111939 A1* | 4/2020 | Brodoceanu | H01L 33/56 |

FOREIGN PATENT DOCUMENTS

| | | | |
|---|---|---|---|
| EP | 1160568 A1 * | 12/2001 | ............ G01N 31/22 |
| EP | 1160568 B1 | 2/2005 | |
| GB | 1434833 A * | 5/1976 | ............ B23K 1/085 |
| GB | 1434833 A | 5/1976 | |
| JP | 58084673 A * | 5/1983 | ......... B23K 3/0653 |
| JP | 58084673 A | 5/1983 | |
| JP | 05223748 A | 8/1993 | |
| JP | 2848086 B2 | 1/1999 | |
| JP | 2002014283 A | 1/2002 | |
| JP | 2004230426 A | 8/2004 | |
| WO | 2011048001 A1 | 4/2011 | |
| WO | 2015068607 A1 | 5/2015 | |
| WO | WO-2015068607 A1 * | 5/2015 | ............ B23K 37/04 |

OTHER PUBLICATIONS

Kalisz et al., "Process Control for Solder Flux", MVTechnology Ltd., 6 pages, accessed on Nov. 20, 2018.

(56) References Cited

OTHER PUBLICATIONS

Perez et al., "Detection and Cleaning of Flux Residue Inside Connectors", Proceedings of the 9th International Symposium on Materials in a Space Environment Noordwijk, The Netherlands, Jun. 16-20, 2003 (ESA SP-540, Sep. 2003), p. 521-526.
Sitko et al., "Optimizing of PCBA Cleaning Process through process calibration tools", EMPC 2013, Sep. 9-12, Grenoble; France, 3 pages.
Mell, et al., "The NIST Definition of Cloud Computing," National Institute of Standards and Technology, U.S. Department of Commerce, Special Publication 800-145, Sep. 2011, pp. 1-7.

* cited by examiner

FLUX RESIDUE DETECTION

BACKGROUND

The present invention relates, generally, to the field of printed circuit board (hereinafter "PCB") manufacturing, and more particularly to flux application during a wave solder process used in PCB manufacturing.

A PCB has patterning or wiring which electrically connect electronic components attached to the PCB. The electronic components may be pin through hole or surface mount. The electronic components may be glued onto the PCB. After placing or attaching the electronic components to pads on a surface of the PCB, flux is applied to portions of the PCB. The flux helps to clean conductive surfaces of the electronic components and the pads, and the flux assists in the flow of solder when the PCB is subsequently passed over a wave solder bath. The solder electrically and mechanically joins the electronic components and the pads on the PCB.

SUMMARY

According to an embodiment, an apparatus is provided. The apparatus includes a flux heater, where the flux heater controls a temperature of a flux spray applied to a printed circuit board, and an infrared camera, wherein the infrared camera provides a thermal image of the flux on the printed circuit board.

According to an embodiment, a method, a computer system, and a computer program product for flux residue detection is provided. The method, computer system and computer program product include setting flux application parameters, applying flux to a printed circuit board, capturing an infrared image of the flux applied to the printed circuit board, and determining there is excess flux residue on the printed circuit board.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to the field of PCB (hereinafter "PCB") manufacturing, and more particularly to flux application during a wave solder process used in PCB manufacturing. The following described exemplary embodiments provide an apparatus, system, method, and program product to, among other things, heat the flux before spraying the flux onto a PCB, use an infrared camera to monitor the flux application onto the PCB, determine if the flux was properly applied, and adjust the flux application as necessary. Therefore, the present embodiment has the capacity to improve the technical field of wave solder process by monitoring the flux application prior to passing the PCB over the wave solder and avoid failure of the PCB due to incorrect application of flux.

Wave soldering is a method of simultaneously connecting multiple electronic components and connectors to a printed circuit board (hereinafter "PCB") using a wave of molten solder. During manufacturing of PCBs, pin though hole or surface mount electronic components may be placed or glued onto a surface of the PCB. Patterning or wiring on the PCB electrically connect components, such as electronic components, wires and connectors attached to the PCB. After placement of the components onto pads on the PCB, flux is applied to the PCB. The flux is used to remove oxide films from pins of components, from wiring pads, and from plated through holes. The flux also promotes wetting to allow the solder to adhere to areas where the solder is desired on the PCB, and the flux helps to prevent re-oxidation during heating of the PCB.

Excessive flux or flux residue on the PCB may cause failures in operation of the PCB. Flux residue may lead to interconnect failures due to contamination from the excessive flux. Flux residue on a surface of the PCB and on pins of components on the PCB may lead to electric shorts and unintended electronic connections between pins of the components and wiring on the PCB. Flux residue may result in electrochemical migration causing a leakage current between two isolated circuits resulting in a short circuit. Flux residues may lead to critical quality issues and reliability risks resulting in rework of the PCB or scrapping of the PCB.

An insufficient amount of flux may also cause failures in the operation of the PCB. Insufficient flux may lead to connections failures due to the solder not adhering to pins of the components or connectors and the pads on the PCB, due to the flux not cleaning the pins and the pads, the flux not wetting the pins and the pads, and the solder not forming an electrical and mechanical connection between the pins and the pads. The insufficient flux may lead to insufficient application of solder, causing failure of electrical connection and failure of structural connection between the pins and pads. Insufficient flux application may lead to quality issues and reliability risks resulting in rework of the PCB or scrapping of the PCB.

The PCB may be mounted on a pallet or carrier. The pallet may have openings in which portions of a bottom of the PCB are exposed, allowing flux and solder to come in contact with uncovered portions of the bottom of the PCB. In some embodiments, the pallet may prevent flux and solder from reaching the covered portions of the bottom of the PCB. In some instances, the flux may be unintentionally applied to the covered portions of the bottom of the PCB. For example, the flux may leak between the pallet and the PCB. Alternatively, the PCB may be incorrectly mounted on the pallet, allowing flux onto areas of the PCB intended to be protected by the pallet. In an example, the flux may be improperly prepared or contain an incorrect mixture of components, allowing the flux to have lower viscosity and become able to leak between the PCB and the pallet. In another example, the flux may be applied at a pressure that is higher than intended which forces the flux to leak between the pallet and the PCB.

Alternatively, an insufficient amount of flux may be applied to the bottom of the PCB. In an embodiment, a spray of the flux may occur too soon or too late while the PCB is passing over a flux sprayer on a conveyor belt, thereby missing the proper timeline of flux application. The flux may be applied at insufficient pressure such that the flux application falls does not reach the PCB. A flux container may have an insufficient amount of flux to adequately spray on the PCB.

Control of flux application is dependent upon several factors, including flux volume, flux components, flux application method and patterning, flux application temperature, PCB design, pallet design, flux cleaning process and avoidance of cross-contamination, among other things.

Monitoring the flux application in real-time can improve flux application and prevent excess flux residue or insufficient application of flux, thereby improving the quality and reliability of the wave soldering process and the quality and reliability of the PCB. Improvement of the flux application may reduce PCB failures and help control production expenses in the manufacture of PCBs, by reducing PCBs which need replacement or re-work.

According to an embodiment, a flux residue detection process may include heating the flux prior to application of the flux to the printed circuit board. An infrared camera may then be used to obtain a thermal image of the printed circuit board, which can be used to identify all areas of the printed circuit board where flux has been applied. The thermal image can then be used to identify if the flux was properly applied. Specifically, each thermal image is compared to a baseline thermal image which shows an image with a correct application of flux to the PCB. Discrepancies between the thermal image and the baseline thermal image suggest flux was not correctly applied to the PCB. In an embodiment, the flux may be applied to areas on the printed circuit board where flux should not be applied. Alternatively, there may be areas on the printed circuit board which were intended to have flux applied, however flux was not applied. Adjustments to the flux operation can be made based on the comparison between the thermal image and the baseline thermal image to improve the flux application onto the PCB.

The following described exemplary embodiments provide an apparatus, system, method, and program product to monitor flux application during a wave solder process.

Figure 1:
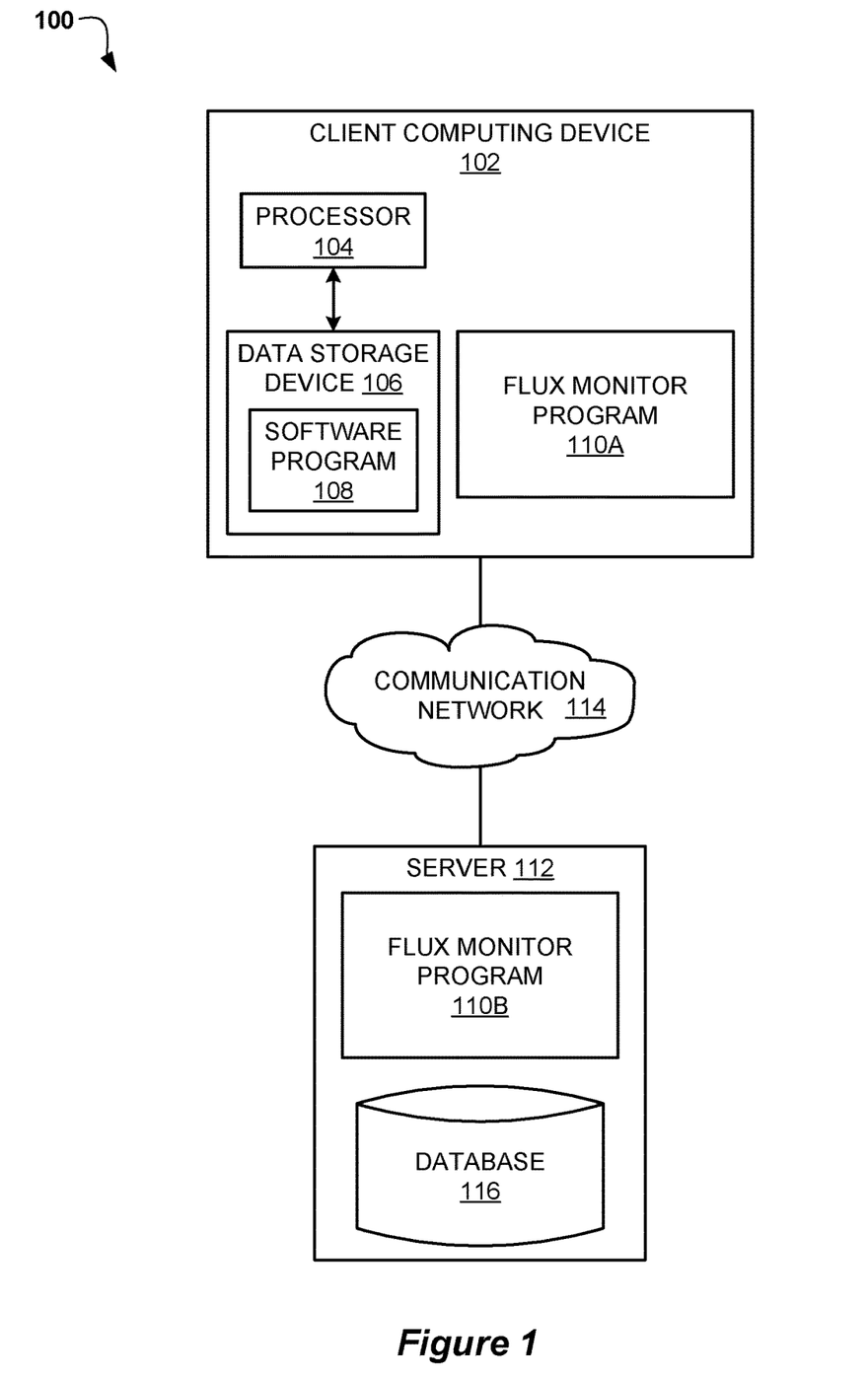
FIG. 1 illustrates an exemplary networked computer environment according to an embodiment of the present invention.

Referring to FIG. 1, an exemplary networked computer environment 100 is depicted, according to an embodiment. The networked computer environment 100 may include client computing device 102 and a server 112 interconnected via a communication network 114. According to at least one implementation, the networked computer environment 100 may include a plurality of client computing devices 102 and servers 112, of which only one of each is shown for illustrative brevity.

The communication network 114 may include various types of communication networks, such as a wide area network (WAN), local area network (LAN), a telecommunication network, a wireless network, a public switched network and/or a satellite network. The communication network 114 may include connections, such as wire, wireless communication links, or fiber optic cables. It may be appreciated that FIG. 1 provides only an illustration of one implementation and does not imply any limitations with regard to the environments in which different embodiments may be implemented. Many modifications to the depicted environments may be made based on design and implementation requirements.

Client computing device 102 may include a processor 104 and a data storage device 106 that is enabled to host and run a software program 108 and a flux monitor program 110A and communicate with the server 112 via the communication network 114, in accordance with an embodiment of the invention. Client computing device 102 may be, for example, a mobile device, a telephone, a personal digital assistant, a netbook, a laptop computer, a tablet computer, a desktop computer, or any type of computing device capable of running a program and accessing a network. As will be discussed with reference to FIG. 4, the client computing device 102 may include internal components and external components, respectively.

The server 112 may be a laptop computer, netbook computer, personal computer (PC), a desktop computer, or any programmable electronic device or any network of programmable electronic devices capable of hosting and running a flux monitor program 110B and a database 116 and communicating with the client computing device 102 via the communication network 114, in accordance with embodiments of the invention. As will be discussed with reference to FIG. 4, the server 112 may include internal components and external components, respectively. The server 112 may also operate in a cloud computing service model, such as Software as a Service (SaaS), Platform as a Service (PaaS), or Infrastructure as a Service (IaaS). The server 112 may also be located in a cloud computing deployment model, such as a private cloud, community cloud, public cloud, or hybrid cloud.

According to the present embodiment, the flux monitor program 110A, 110B may be a program capable of monitoring flux application and directing changes in the flux application during a wave solder process. The flux residue detection method is explained in further detail below with respect to FIGS. 2 and 3.

Figure 2:
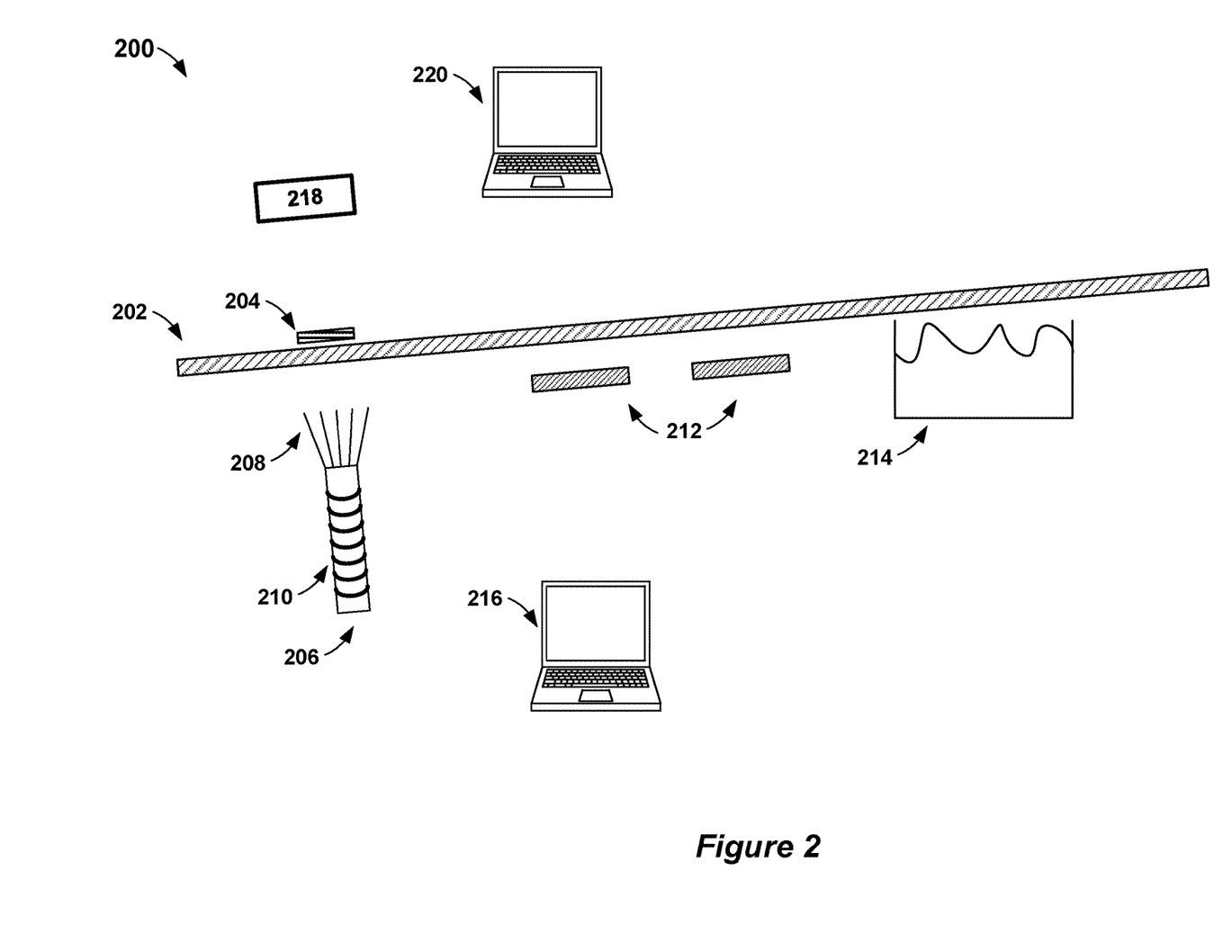
FIG. 2 illustrates a wave solder system, according to an embodiment of the present invention.

Referring now to FIG. 2, a wave solder apparatus 200 is illustrated, according to an embodiment. The wave solder apparatus 200 may include a conveyor 202, a fluxer 206, one or more pre-heaters 212, and a solder bath 214.

The conveyor 202 transports a printed circuit board (hereinafter "PCB") 204 through different areas of the wave solder apparatus 200. The conveyor 202 transports the PCB 204 from left to right as illustrated in FIG. 2, exposing a bottom of the PCB 204 sequentially to the fluxer 206, the one or more pre-heaters 212 and the solder bath 214. In some embodiments, the conveyor 202 may be mounted at an increasing angle, as illustrated in FIG. 2. The PCB 204 may be mounted on a pallet or carrier. The pallet may have openings in which portions of the bottom of the PCB 204 are exposed, allowing flux and solder to come in contact with uncovered portions of the bottom of the PCB 204, when the conveyor 202 passes through different areas of the wave solder apparatus 200. In some embodiments, the pallet may prevent flux and solder from reaching covered portions of the PCB 204.

The fluxer 206 may include a container, a pump and a nozzle. During operation, the fluxer 206 dispenses or sprays flux 208 onto the bottom of the PCB 204 as it passes on the conveyor 202.

Typically, the flux 208 is stored in the container and dispensed at room temperature, generally 20 C to 26 C, and the flux 208 is in an inactive state in room temperature, indicating the flux is stable and non-corrosive.

After the flux 208 is applied to the PCB 204, the PCB 204 passes over the one or more pre-heaters 212, which helps to avoid thermal shock of the PCB 204 when entering the solder bath 214. Additionally, the one or more pre-heaters 212 may be used to activate the flux 208 which has been applied to the bottom of the PCB 204. When the flux 208 is heated to the activation temperature, it may become chemically activate and disassociate the organic acid such that it reduces or eliminates oxidation from conductive surfaces of the PCB 204, such as wiring pads, plated through holes, and pins of components on the PCB 204. In an embodiment, the PCB 204 may be exposed to the one or more pre-heaters 212 for 5 to 30 seconds.

The flux 208 could have an activation temperature, or activation temperature range, which may range between about 100 C to about 260 C. The flux 208 may include a solvent and a low solid content rosin. The flux 208 heating range is determined by flux properties which may change with temperature changes. The flux 208 heating range is based on an evaporation rate, an evaporation rate upper limit, a viscosity, a viscosity lower limit, an infrared detection limit or range, a soldering preheat limit, and other limits of the flux 208.

The evaporation rate increases with temperature. An evaporation rate upper limit is important to maintain a solubility and diffusivity of the flux 208, such that the spray process and distribution of the flux 208 occurs properly. The evaporation rate upper limit is a temperature above which components of the flux 208 would evaporate or degrade, negatively affecting the flux 208 spray process effectiveness.

The viscosity decreases with temperature. The viscosity lower limit is a temperature below which the flux 208 would have not have a guarantee for adhesiveness to the PCB 204, and may drip off the PCB 204 due to low viscosity.

In an embodiment, the activation temperature for the flux 208 ranges from about 140 C to about 180 C, and more particularly 150 C to 170 C, or 155 C to 165 C.

After pre-heating, the PCB 204 passes over the solder bath 214. The solder bath 214 may include a pan of solder and a pump that produces a wave of molten solder. As the PCB 204 passes over the solder bath 214, the molten solder wave contacts the bottom surface of the PCB 204. The molten solder wets the leads of the components on the PCB 204 and fills the plated through holes of the PCB 204 in areas of the PCB 204 not protected by the pallet. Different combinations of tin, copper, nickel, lead and other metals may be used to create solder, and the combinations used are dependent upon desired properties of the solder. Different solder properties include a range of melting points, durations of time for setting the solder, corrosion resistances, long term reliability, performance requirements and environmental concerns. For example, restrictions on solder materials including lead for the Restriction of Hazardous Substances Direction compliance requirements affect the desired solder mixture.

In an embodiment, the solder may include 95.5 to 96.5% tin, 3 to 4% silver, and 0.5% copper. In an alternate embodiment, the solder may include SN100C solder, which is 99.25% tin, 0.7% copper, 0.05% nickel and less than 0.01% germanium.

In an embodiment, a solder including tin, copper, and nickel having a melting temperature of 227° C. and a set point temperature of 270° C. may be used in the wave solder technique.

In an embodiment, the wave solder apparatus 200 may include additional components for use in the flux residue detection method, including a flux heater 210, a flux spray controller 216, an infrared (hereinafter "IR") camera 218 and an IR camera monitor 220. These additional components may be used to monitor the flux 208 as it is applied to the PCB 204 and insure that the flux 208 is properly applied to only the desired areas or portions. In an embodiment, the flux residue detection method helps to identify that the flux 208 is properly applied in areas of the PCB 204, where there are openings in the pallet allowing the portions of a bottom of the PCB 204 to be exposed. In an embodiment, the flux residue detection method helps to identify a proper amount of flux 208 is applied, to monitor for excess flux 208 and an adequate application of flux 208. The flux residue detection method may help to identify instances where the flux 208 is present in areas not intended for flux to be applied, for example, those areas that are protected by the covered portions of the pallet. For example, excess flux 208 may be applied, and may leak between the covered portions of the pallet and the PCB 208. Alternatively, the flux 208 may be applied below the viscosity limit of the flux at the application temperature, and the flux 208 may leak between the covered portions of the pallet and the PCB 208. The flux residue detection method may help to identify instances where the flux 208 is not present in areas intended for flux to be applied, for example, those areas that are have openings in the pallet and are not protected by the covered portions of the pallet.

The flux spray controller 216 may be an example of a client computing device 102, as described above. The flux spray controller 216 may be used to operate the flux monitor program 110A, 110B, a program capable of monitoring flux application and directing modifications in flux application during the wave solder process. The flux spray controller 216 may control the operation of the fluxer 206, the flux heater 210, and the flux 208, and other components of the wave solder apparatus 200.

The flux spray controller 216 may control certain parameters of the flux 208 application, such as a flow of the flux 208 from the fluxer 206 onto the PCB 204, pressure of the flux 208, a speed of a conveyor 202, a temperature of the flux heater 210, a flux spray pattern and duration from the fluxer 206, a temperature of the one or more pre-heaters 212, among other items.

The flux spray controller 216 may receive input from the IR camera monitor 220, which may be used to determine if the flux application is operating properly or if any changes should be made in the flux application.

The flux heater 210 may be enabled to heat and maintain a temperature of the fluxer 206 and heat and maintain a temperature of the flux 208. In an embodiment, the flux heater 210 may be a coil which surrounds the fluxer 206 and is controlled by the flux spray controller 216.

A determination of a heating temperature range for the flux heater 210 is critical to the application of this invention. The flux 208 must be applied at a high enough temperature as to be detected by the IR camera 218, taking into account flux property changes with temperature and staying below a preheat lower temperature. The preheat lower temperature used in the one or more pre-heaters 212 must be maintained in order to not affect a soldering profile for subsequent steps of the wave solder process.

The heating temperature range for the flux heater 210 must be higher than a detection temperature of the IR camera 218 such that the IR camera 218 detects the flux 208 on areas of the PCB 204 due to the temperature of the flux 208 on the PCB 204 compared to areas of the PCB 204 which do not have the flux 208 applied. The heating temperature range for the flux heater 210 must be lower than the preheat temperature such that the flux 208 is not activated. The heating temperature range for the flux heater 210 must be below the evaporation rate upper limit of the flux 208. The heating temperature range for the flux heater 210 must be above the viscosity lower limit of the flux 208.

In an embodiment, the IR camera 218 may be able to detect a temperature of flux 208 on the PCB 204 which is above 40 C, and a pre-heat lower limit of the flux 208 may be 80 C. In an embodiment, as a result of analyzing the flux property changes, the heating temperature range for the flux heater 210 may be approximately 65 C-70 C.

The IR camera 218 may be used to obtain a thermal image of the PCB 204 during or immediately after the flux operation. The IR camera 218 may also be called a thermographic camera, a thermal imaging camera, or infrared thermography. The IR camera 218 may provide still images or video images. The IR camera 218 detects thermal infrared energy and converts it to a thermal image. The IR camera 218 provides the thermal image or video of the PCB 204 showing a temperature map of the PCB 204. The heated flux 208 on the PCB 204 will be shown as heated areas on the thermal image, and may be identified with a first color. Areas of the PCB 204 without flux 208 may be shown in a second color on the thermal image.

The IR camera monitor 220 may be another example of a client computing device 102, as described above. The IR camera monitor 220 may be used to operate the IR camera 218, in combination with the flux spray controller 216. The IR camera monitor 220 may store still thermal images or video images of the PCB 204 captured by the IR camera 218. In an embodiment, the flux spray controller 216 and the IR camera monitor 220 may be combined into a single controller.

The IR camera monitor 220 may provide a comparison of the thermal image or video image of the PCB 204 and compare the thermal image or video image to a baseline thermal image or video of the PCB 204. The baseline thermal image shows a correct application of flux 208 to the PCB 204, and any differences between the thermal image or video and the baseline thermal image or video may indicate that the flux 208 application was applied incorrectly. Incorrect applications include an insufficient amount of flux 208 applied and flux 208 applied in areas not intended for flux application. The images and information regarding the comparison of the thermal image to the baseline thermal image may be provided to the flux spray controller 216.

The flux spray controller 216 may make changes in the application of the flux 208 in response to the thermal image or video. The changes in the application of the flux 208 may include an increase or a decrease a pressure of the flux 208, an increase or a decrease an application pressure of the flux 208, an increase or a decrease a speed of the conveyor 202, a change in a temperature of the flux heater 210, a change in a flux spray pattern and duration from the fluxer 206, among other modifications.

Figure 3:
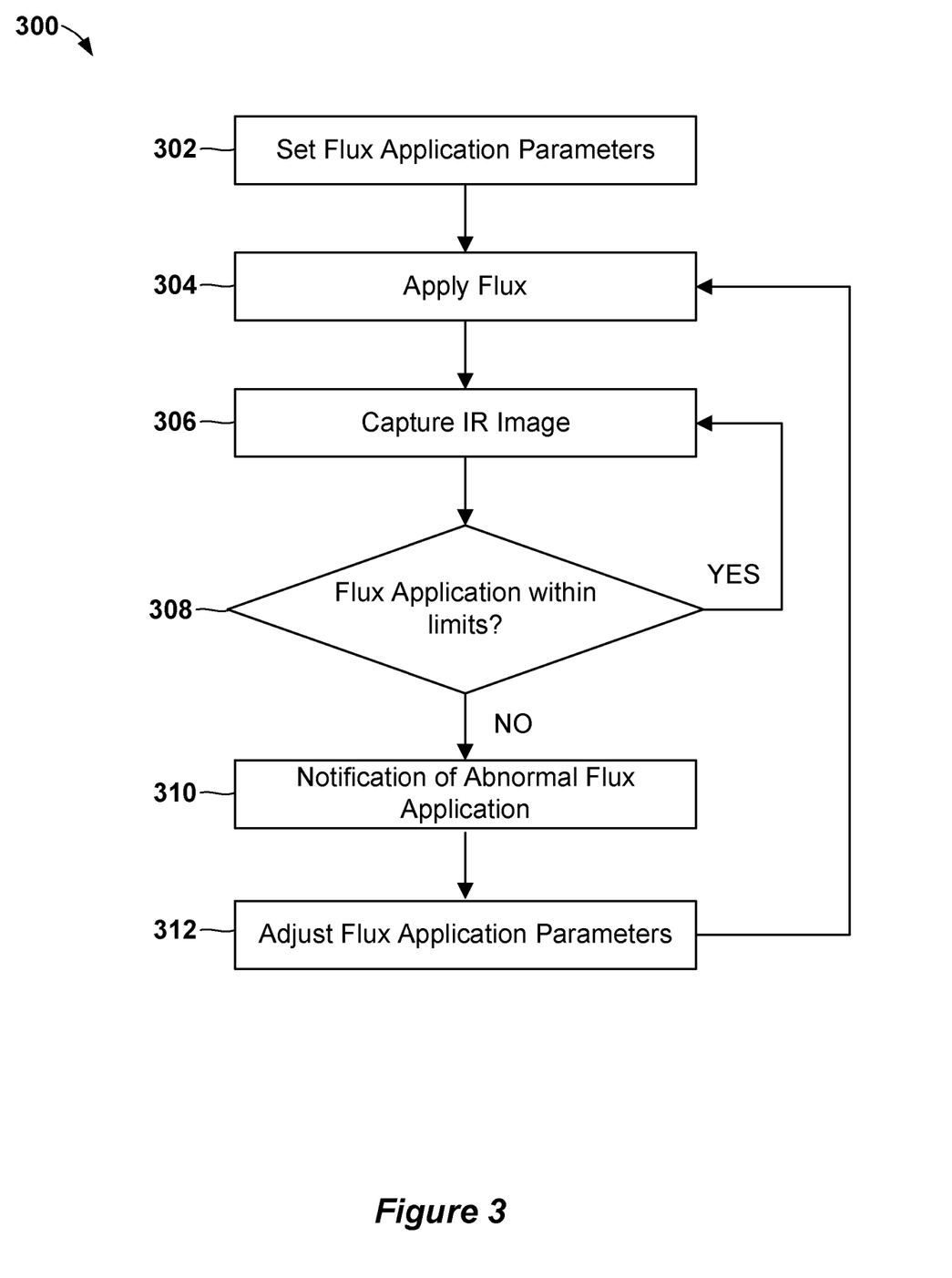
FIG. 3 illustrates an operational flowchart illustrating a flux residue detection process, according to an embodiment of the present invention.

The flux residue detection method is further described in FIG. 3.

Referring now to FIG. 3, an operational flowchart illustrating a flux residue detection method 300 is depicted, according to an embodiment. At 302, the flux monitor program 110A, 110B sets the flux application parameters. The flux application parameters may include controls for the operation of the conveyor 202, the fluxer 206, the flux 208, the flux heater 210, and other components of the wave solder apparatus 200. The controls for the operation of the conveyor 202 may include a conveyor 202 speed. The controls for the operation of the fluxer 206 may include application pressure of the flux 208, a viscosity of the flux 208, and a flux 208 spray duration and coverage area. The controls for the flux heater 210 may include an operating temperature of the flux heater 210. In an embodiment, the flux heater 210 heats the flux 208 before application of the flux 208 to the PCB 204.

At 304, the flux 208 may be applied to the bottom side of the PCB 204. As described above, openings in the pallet allow the flux 208 to be applied to exposed areas of the bottom side of the PCB 204.

At 306, the IR camera 218 may capture a thermal image or a thermal video of the PCB 204. The thermal image or video may show areas of the PCB 204 where the heated flux 208 has been applied. The IR camera 218 may store the thermal image or video. The IR camera 218 may also store an baseline thermal image or video of the PCB 204, which is an image of a PCB 204 with the baseline application of the flux 208, which is a correct amount for the application of the flux 208. Alternatively, a range of thermal images may be stored showing an acceptable range of flux 208 application on the PCB 204.

At 308, a determination may be made whether the flux 208 on the PCB 204 is within an acceptable range of amount of the flux 208 on the PCB 204. If the flux 208 is within an acceptable range of flux application, the flux monitor program 110A, 110B may return to 306, as described above, to continue to monitor the flux application.

If the flux 208 is determined to not within an acceptable range of flux application, the flux monitor program 110A, 110B may continue to 310, notification of abnormal flux application. This may include an auditory or visual alarm, a stop of the wave solder apparatus 200, a status event stored in a memory of the flux spray controller 216, an email or text notification, among other notifications. In an embodiment, the flux monitor program 110, 110B may continuously store thermal images or video of each of the PCBs 204 which are exposed to the wave solder apparatus 200 to document for analysis and future reference, for example, during failure analysis. In an embodiment, the PCB 204 with an incorrect amount of flux 208 applied may be physical reworked to remove excess flux 208.

At 312, the flux monitor program 110, 110B may adjust flux application parameters. A determination of parameter adjustments may be made. Once the adjustments are made, the flux monitor program 110A, 110B may then return to apply flux at 304.

It may be appreciated that FIGS. 2 and 3 provide an illustration of an implementation and does not imply any limitations with regard to how different embodiments may be implemented. Many modifications to the depicted environments may be made based on design and implementation requirements.

Figure 4:
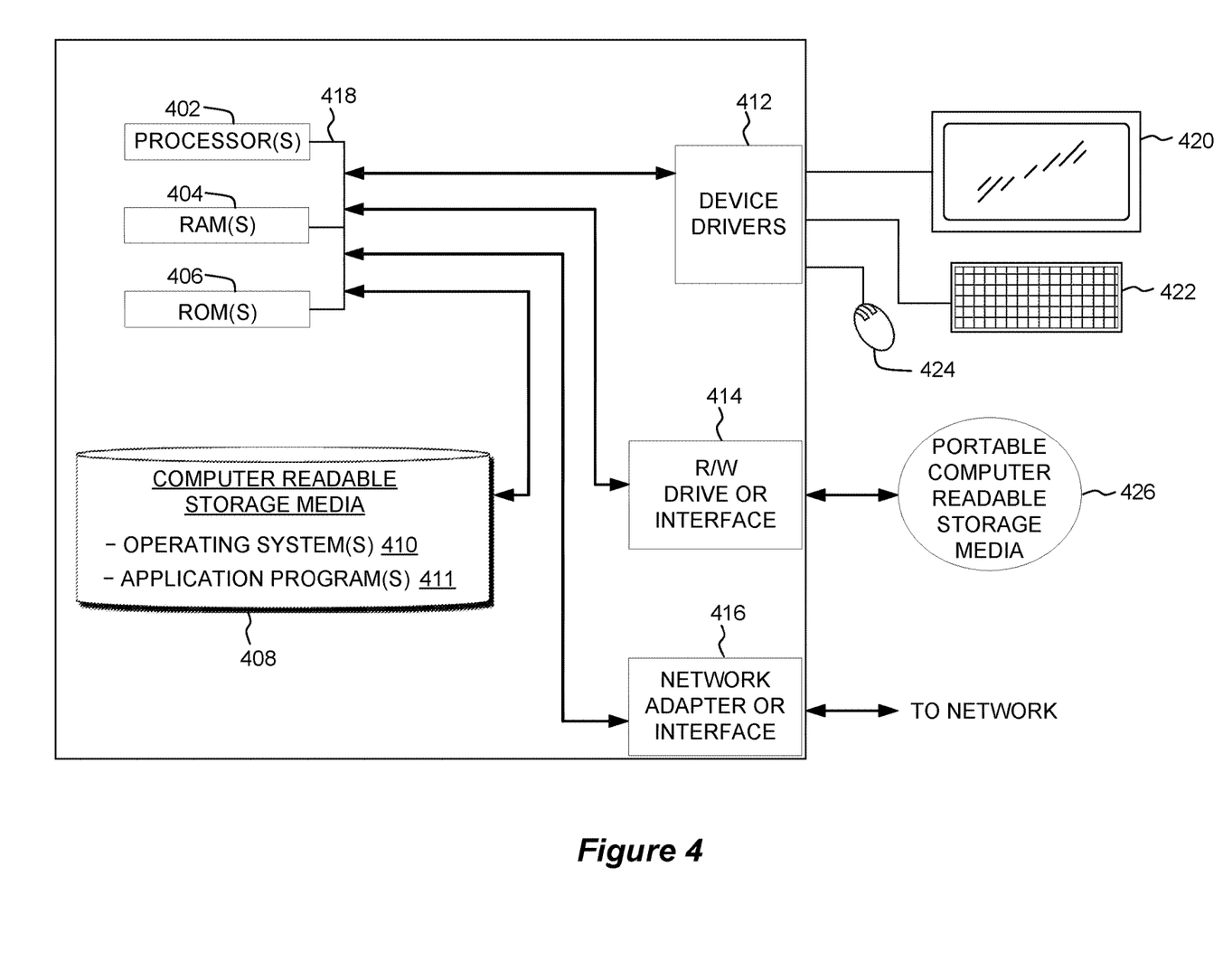
FIG. 4 illustrates a block diagram of internal and external components of computers and servers depicted in FIG. 1, according to an embodiment of the present invention.

Referring now to FIG. 4, a block diagram of components of a computing device, such as the server 112 of FIG. 1, in accordance with an embodiment of the present invention is shown. It should be appreciated that FIG. 4 provides only an illustration of an implementation and does not imply any limitations with regard to the environments in which different embodiments may be implemented. Many modifications to the depicted environment may be made.

The computing device may include one or more processors 402, one or more computer-readable RAMs 404, one or more computer-readable ROMs 406, one or more computer readable storage media 408, device drivers 412, read/write drive or interface 414, network adapter or interface 416, all interconnected over a communications fabric 418. Communications fabric 418 may be implemented with any architecture designed for passing data and/or control information between processors (such as microprocessors, communications and network processors, etc.), system memory, peripheral devices, and any other hardware components within a system.

One or more operating systems 410, and one or more application programs 411 are stored on one or more of the computer readable storage media 408 for execution by one or more of the processors 402 via one or more of the respective RAMs 404 (which typically include cache memory). For example, the flux monitor program 110A, 110B, may be stored on the one or more of the computer readable storage media 408. In the illustrated embodiment, each of the computer readable storage media 408 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

The computing device may also include the R/W drive or interface 414 to read from and write to one or more portable computer readable storage media 426. Application programs 411 on the computing device may be stored on one or more of the portable computer readable storage media 426, read via the respective R/W drive or interface 414 and loaded into the respective computer readable storage media 408.

The computing device may also include the network adapter or interface 416, such as a TCP/IP adapter card or wireless communication adapter (such as a 4G wireless communication adapter using OFDMA technology). Application programs 411 may be downloaded to the computing device from an external computer or external storage device via a network (for example, the Internet, a local area network or other wide area network or wireless network) and network adapter or interface 416. From the network adapter or interface 416, the programs may be loaded onto computer readable storage media 408. The network may comprise copper wires, optical fibers, wireless transmission, routers, firewalls, switches, gateway computers and/or edge servers.

The computing device may also include a display screen 420, a keyboard or keypad 422, and a computer mouse or touchpad 424. Device drivers 412 interface to display screen 420 for imaging, to keyboard or keypad 422, to computer mouse or touchpad 424, and/or to display screen 420 for pressure sensing of alphanumeric character entry and user selections. The device drivers 412, R/W drive or interface 414 and network adapter or interface 416 may comprise hardware and software (stored on computer readable storage media 408 and/or ROM 406).

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access a normalized search engine or related data available in the cloud. For example, the normalized search engine could execute on a computing system in the cloud and execute normalized searches. In such a case, the normalized search engine could normalize a corpus of information and store an index of the normalizations at a storage location in the cloud. Doing so allows a user to access this information from any computing system attached to a network connected to the cloud (e.g., the Internet).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
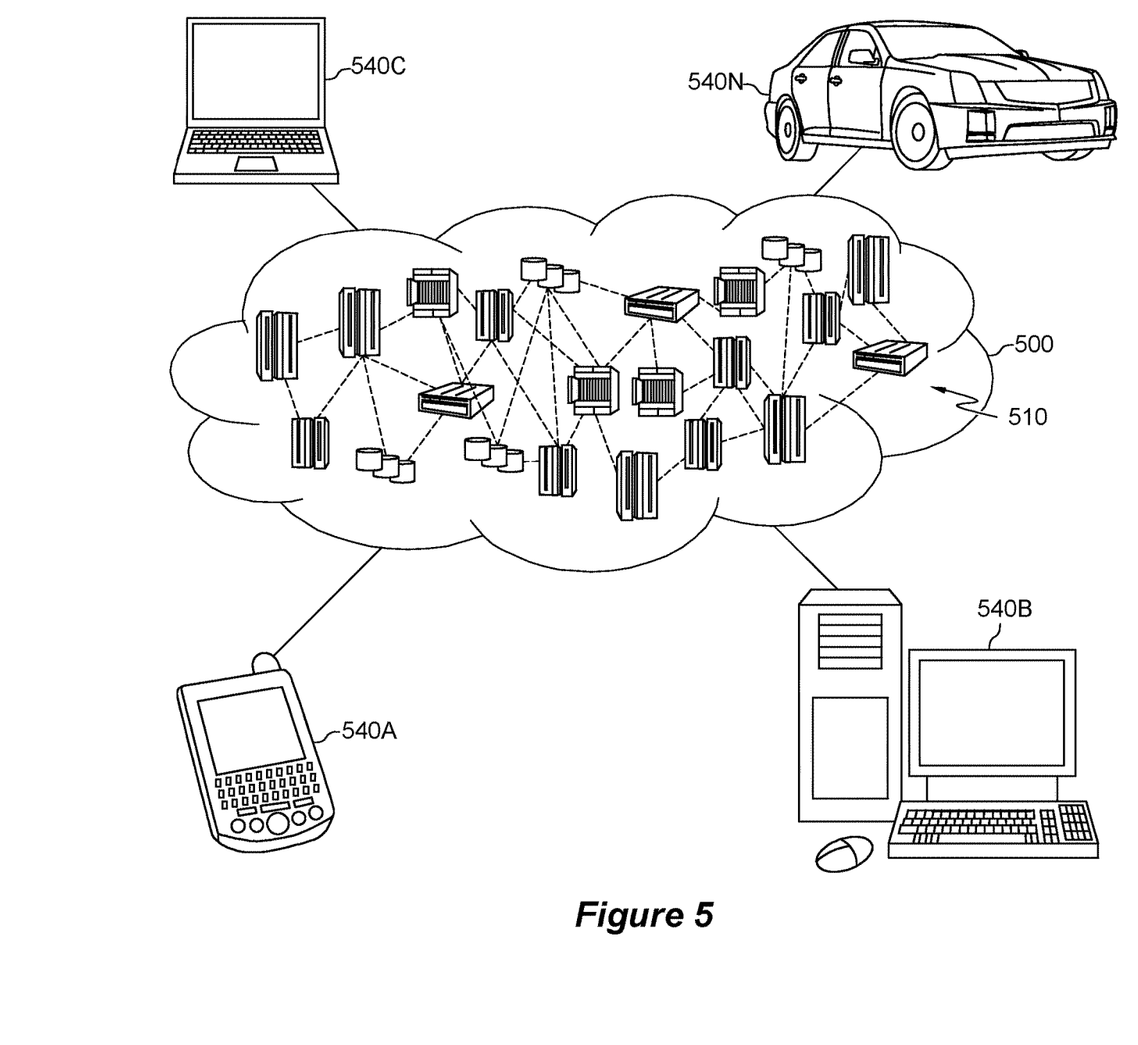
FIG. 5 illustrates a cloud computing environment, according to an embodiment of the present invention.

Referring now to FIG. 5, illustrative cloud computing environment 500 is depicted. As shown, cloud computing environment 500 includes one or more cloud computing nodes 510 with which local computing devices used by cloud consumers, such as, for example, personal digital assistant (PDA) or cellular telephone 540A, desktop computer 540B, laptop computer 540C, and/or automobile computer system 540N may communicate. Cloud computing nodes 510 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 540A-N shown in FIG. 5 are intended to be illustrative only and that cloud computing nodes 510 and cloud computing environment 500 can communicate with any type of computerized device over any type of network and/or network addressable connection (e.g., using a web browser).

Figure 6:
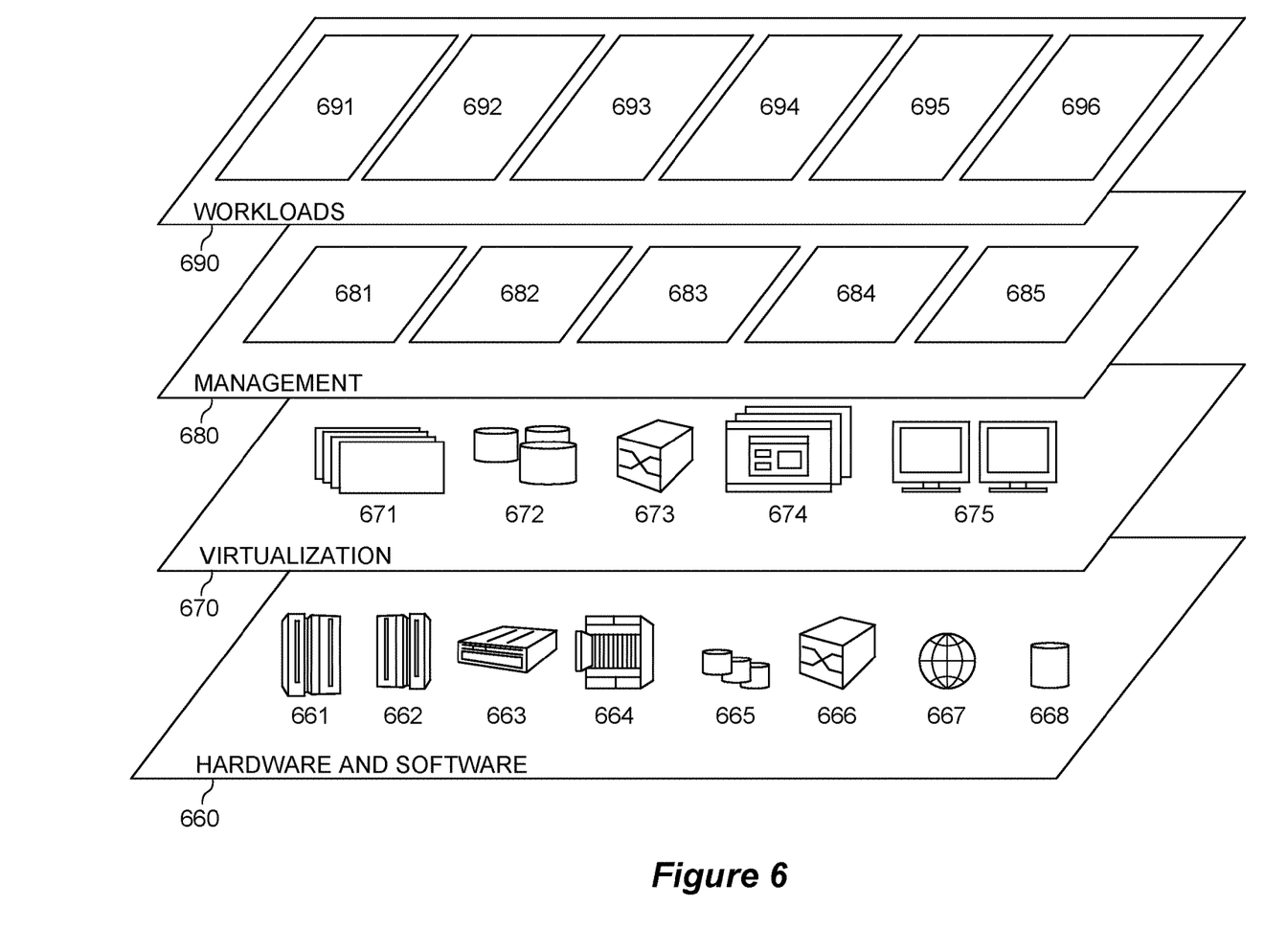
FIG. 6 illustrates abstraction model layers according to an embodiment of the present invention.

Referring now to FIG. 6, a set of functional abstraction layers provided by cloud computing environment 500 (as shown in FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 660 includes hardware and software components. Examples of hardware components include: mainframes 661; RISC (Reduced Instruction Set Computer) architecture based servers 662; servers 663; blade servers 664; storage devices 665; and networks and networking components 666. In some embodiments, software components include network application server software 667 and database software 668.

Virtualization layer 670 provides an abstraction layer from which the following examples of virtual entities may be provided: virtual servers 671; virtual storage 672, for example the data storage device 106 as shown in FIG. 1; virtual networks 673, including virtual private networks; virtual applications and operating systems 674; and virtual clients 675.

In an example, management layer 680 may provide the functions described below. Resource provisioning 681 provides dynamic procurement of computing resources and other resources that are utilized to perform tasks within the cloud computing environment. Metering and Pricing 682 provide cost tracking as resources are utilized within the cloud computing environment, and billing or invoicing for consumption of these resources. In an example, these resources may include application software licenses. Security provides identity verification for cloud consumers and tasks, as well as protection for data and other resources. User portal 683 provides access to the cloud computing environment for consumers and system administrators. Service level management 684 provides cloud computing resource allocation and management such that required service levels are met. Service Level Agreement (SLA) planning and fulfillment 685 provide pre-arrangement for, and procurement of, cloud computing resources for which a future requirement is anticipated in accordance with an SLA.

Workloads layer 690 provides examples of functionality for which the cloud computing environment may be utilized. Examples of workloads and functions which may be provided from this layer include: mapping and navigation 691; software development and lifecycle management 692; virtual classroom education delivery 693; data analytics processing 694; transaction processing 695; and flux determination 696. The flux determination 696 may monitor flux application and provide feedback for improvement of flux application.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modification s and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for flux detection, the method comprising:
    setting flux application parameters, wherein the flux application parameters comprise an evaporation limit of the flux, a viscosity limit of the flux, an infrared detection limit of an infrared camera used to capture an infrared image of the flux applied to the printed circuit board and a soldering preheat limit;
    applying flux to a printed circuit board; and
    capturing an infrared image of the flux applied to the printed circuit board.

2. The method according to claim 1, further comprising:
    determining excess flux has been applied to the printed circuit board, based on the infrared image.

3. The method according to claim 2, further comprising:
    adjusting the flux application parameters, based on the determination that the flux is applied outside application limits.

4. The method according to claim 1, wherein the flux application parameters comprise:
    an application temperature of the flux.

5. The method according to claim 1, further comprising:
    pre-heating the printed circuit board; and
    passing the printed circuit board over a wave solder bath.

6. A method for flux residue detection, the method comprising:
    setting flux application parameters;
    applying flux to a printed circuit board;
    capturing an infrared image of the flux applied to the printed circuit board;
    determining the flux applied is outside flux application limits, based on the infrared image;
    adjusting the flux application parameters, based on the determination that the flux is applied outside application limits, wherein the flux application parameters comprise an application temperature of the flux, an evaporation limit of the flux, a viscosity limit of the flux, an infrared detection limit of an infrared camera used to capture an infrared image of the flux applied to the printed circuit board and a soldering preheat limit; and
    determining there is excess flux residue on the printed circuit board.

7. The method according to claim 6, further comprising:
    pre-heating the printed circuit board; and
    passing the printed circuit board over a wave solder bath.

8. The method according to claim 6, further comprising:
    comparing the infrared image to a baseline infrared image of flux applied to the printed circuit board.

9. The method according to claim 6, further comprising:
    storing the infrared image of the printed circuit board.

* * * * *